US009942684B2

(12) United States Patent
Cheon et al.

(10) Patent No.: US 9,942,684 B2
(45) Date of Patent: Apr. 10, 2018

(54) AUDIO SIGNAL PROCESSING METHOD AND AUDIO SIGNAL PROCESSING APPARATUS

(71) Applicant: SAMSUNG ELECTRONICS CO., LTD., Suwon-si (KR)

(72) Inventors: Byeong-geun Cheon, Anyang-si (KR); Han-ki Kim, Suwon-si (KR); Hae-kwang Park, Suwon-si (KR); Young-suk Song, Suwon-si (KR); Eun-mi Oh, Seoul (KR); Dong-hyun Lim, Seoul (KR); Jae-youn Cho, Suwon-si (KR); Joon-ho Son, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/212,831

(22) Filed: Jul. 18, 2016

(65) Prior Publication Data

US 2017/0019748 A1 Jan. 19, 2017

(30) Foreign Application Priority Data

Jul. 17, 2015 (KR) ........................ 10-2015-0101988

(51) Int. Cl.
*H04R 5/02* (2006.01)
*H04R 29/00* (2006.01)
*H04S 7/00* (2006.01)
*H04R 27/00* (2006.01)
*H03G 5/00* (2006.01)

(52) U.S. Cl.
CPC ............. *H04S 7/301* (2013.01); *H04R 27/00* (2013.01); *H04R 29/007* (2013.01); *H04R 2227/003* (2013.01); *H04R 2227/005* (2013.01)

(58) Field of Classification Search
CPC . H04S 7/301; H04S 7/305; H04S 3/00; H04S 7/302; H04S 2400/15; H04S 7/303; H04S 7/307; H04S 1/00; H04S 7/308; H04S 2400/01; H04S 2400/11; H04S 2400/13; H04S 2420/01; H04S 7/30; H04R 2227/005; H04R 3/04; H04R 29/001; H04R 29/002; H04R 2499/13; H04R 29/00; H04R 3/12; H04R 5/04; H04R 3/00; H04R 2420/07; H04R 2430/20; H04R 1/323; H04R 5/02; H04R 2205/024; H04R 2227/007; H04R 2420/05
USPC ......... 381/59, 58, 303, 17, 98, 103, 56, 107, 381/122, 101, 119, 124, 18, 26, 61, 77, 381/91, 92, 94.1, 94.2, 95, 96
See application file for complete search history.

(56) References Cited

U.S. PATENT DOCUMENTS 6,728,584 B1 * 4/2004 Duan .................... H04H 60/04
381/119
7,668,243 B2 2/2010 Ho et al.
(Continued)

FOREIGN PATENT DOCUMENTS

JP 2007-60253 A 3/2007
JP 2008-191315 A 8/2008
(Continued)

*Primary Examiner* — Norman Yu
(74) *Attorney, Agent, or Firm* — Sughrue Mion, PLLC

(57) ABSTRACT

An audio signal processing method and an audio signal processing apparatus for synchronizing audio based on synchronization error between audio signals.

19 Claims, 17 Drawing Sheets

(56) References Cited

U.S. PATENT DOCUMENTS

| | | | | |
|---|---|---|---|---|
| 8,965,547 | B2 * | 2/2015 | Wabnik | G10L 19/018 380/253 |
| 9,210,510 | B2 | 12/2015 | Kang et al. | |
| 2002/0136414 | A1 * | 9/2002 | Jordan | H04S 3/00 381/58 |
| 2003/0208359 | A1 | 11/2003 | Kang et al. | |
| 2008/0226087 | A1 * | 9/2008 | Kinghorn | H04S 7/301 381/59 |
| 2012/0288124 | A1 | 11/2012 | Fejzo et al. | |
| 2014/0074271 | A1 | 3/2014 | Millington | |
| 2014/0185842 | A1 * | 7/2014 | Kang | H04R 5/02 381/303 |

FOREIGN PATENT DOCUMENTS

| | | | |
|---|---|---|---|
| JP | 2013-247524 | A | 12/2013 |
| KR | 10-1391751 | B1 | 5/2014 |

* cited by examiner

AUDIO SIGNAL PROCESSING METHOD AND AUDIO SIGNAL PROCESSING APPARATUS

CROSS-REFERENCE TO RELATED APPLICATION

This application claims priority from Korean Patent Application No. 10-2015-0101988, filed on Jul. 17, 2015, in the Korean Intellectual Property Office, the disclosure of which is incorporated herein by reference in its entirety.

BACKGROUND

1. Field

Method and apparatuses consistent with exemplary embodiments relate to an audio signal processing, and more particularly to synchronizing audio based on synchronization error between audio signals.

2. Description of the Related Art

With advances in multimedia technologies and data processing technologies, a multimedia device may download an audio file and reproduce a corresponding audio signal in real time. Furthermore, a plurality of multimedia devices, such as audio systems (speakers), TVs, and mobile devices, may be connected via a network to receive and transmit audio data. However, audio reproduction problems, such as different reproduction timings or different reproduction lengths, may occur when the multimedia devices are not temporally synchronized with one another.

In this regard, precision time protocol (PTP) was established. The PTP is the IEEE 1588 standard time transport protocol that enables synchronization between networks. Much research has been conducted to provide protocols for synchronizing audio outputs between a plurality of multimedia devices. A representative protocol is a real time protocol (RTP) that supports real-time transmission of multimedia data.

However, due to scheduling for audio processing in a media device, a difference in RTP implementation schemes between multimedia devices, or the like, it may be difficult to achieve audio synchronization. Therefore, there is a need for solving the problem of audio output synchronization.

Furthermore, in order to realize an optimal sound combination between multimedia devices via a network connection, there is a need for an audio signal processing technology appropriate for purpose of usage, such as group mode reproduction, multi-room reproduction, or multi-channel reproduction, taking into account an audio signal reproduction technology and surrounding environment suitable for a role of each device based on synchronization.

SUMMARY

Aspects of exemplary embodiments provide signal processing methods and audio signal processing apparatuses, capable of synchronizing audio outputs between multimedia devices and providing optimal sound quality through appropriate audio signal processing taking into account surrounding environments.

Additional aspects will be set forth in part in the description which follows and, in part, will be apparent from the description, or may be learned by practice of the presented embodiments.

According to an aspect of an exemplary embodiment, there is provided an audio signal processing method of a first audio signal processing apparatus including: outputting a first audio signal; receiving the first audio signal; receiving a second audio signal output by a second audio signal processing apparatus; detecting a first synchronization signal in the first audio signal; detecting a second synchronization signal in the second audio signal; determining a first synchronization error of a difference between a time at which the first synchronization signal is received and a time at which the second synchronization signal is received; and synchronizing audio output of the first audio signal processing apparatus with audio output of the second audio signal processing apparatus based on the first synchronization error.

According to an aspect of an exemplary embodiment, there is provided a first audio signal processing apparatus including: a speaker configured to output a first audio signal; a microphone configured to receive the first audio signal and receive a second audio signal output by a second audio signal processing apparatus; and a controller configured to detect a first synchronization signal in the first audio signal and a second synchronization signal in the second audio signal, determine a first synchronization error of a difference between a time at which the first synchronization signal is received and a time at which the second synchronization signal is received, and synchronize audio output of the first audio signal processing apparatus with audio output of the second audio signal processing apparatus based on the first synchronization error.

BRIEF DESCRIPTION OF THE DRAWINGS

The above and other aspects will become apparent and more readily appreciated from the following description of the exemplary embodiments, taken in conjunction with the accompanying drawings in which.

DETAILED DESCRIPTION OF EXEMPLARY EMBODIMENTS

Figure 1:
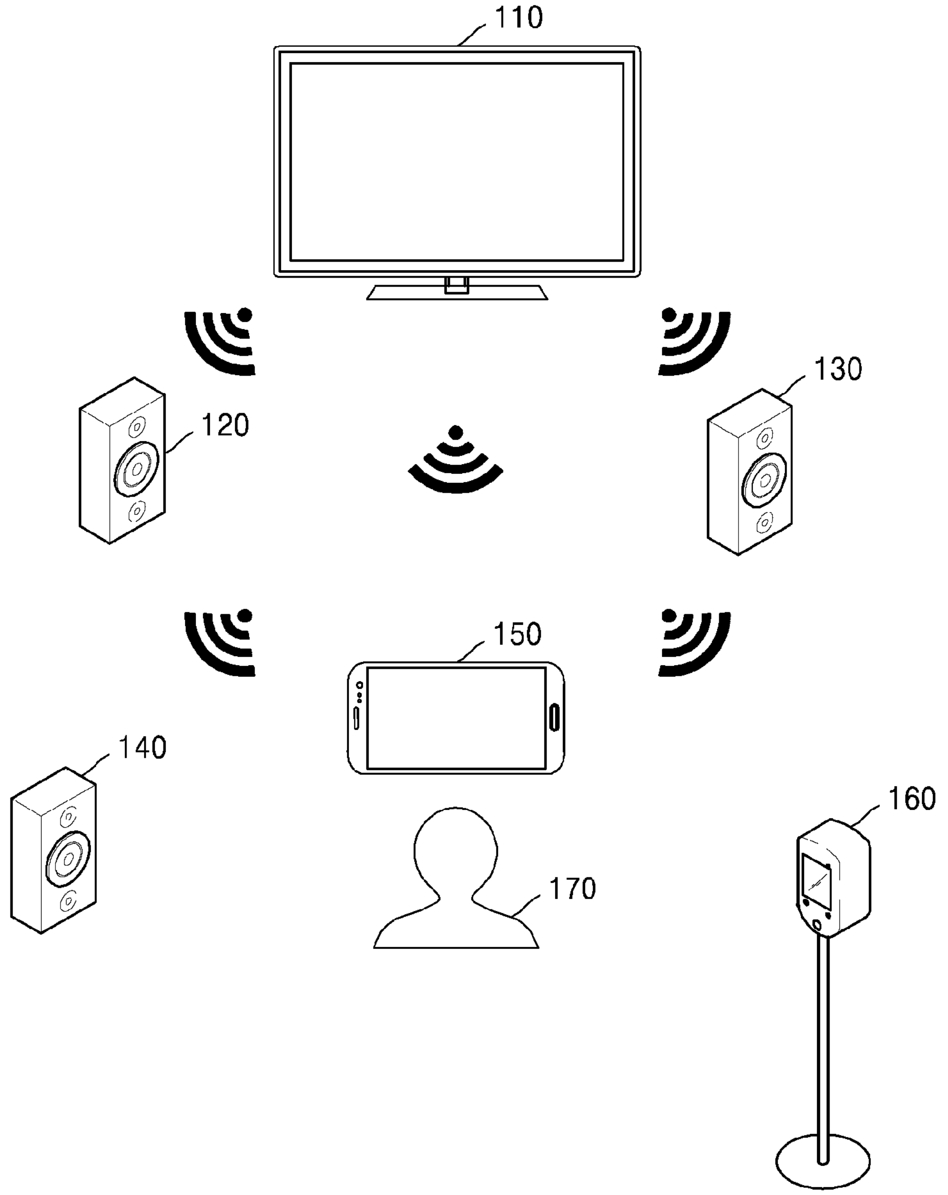
FIG. 1 is a diagram illustrating an audio system connected via a wireless network.

The exemplary embodiments will be described with reference to the accompanying drawings in such a manner that the exemplary embodiments may be easily understood by those of ordinary skill in the art. However, the inventive concept may be implemented in various forms and is not limited to the exemplary embodiments.

For clarity of description, parts having no relation to description are omitted.

Like reference numerals are assigned to like elements throughout the present disclosure and the drawings.

As used herein, the term "and/or" includes any and all combinations of one or more of the associated listed items.

It will be understood that when a region is referred to as being "connected to" or "coupled to" another region, such region may be directly connected or coupled to the other region or intervening regions may be present. It will be understood that the terms "comprise," "include," and "have," when used herein, specify the presence of stated elements, but do not preclude the presence or addition of other elements, unless otherwise defined. Also, the terms "unit" and "module" as used herein represent a unit for processing at least one function or operation, which may be implemented by hardware, software, or a combination of hardware and software.

The terms as used herein are those general terms currently widely used in the art by taking into account functions in the present disclosure, but the terms may vary according to the intention of those of ordinary skill in the art, precedents, or new technology in the art. In addition, specified terms may be selected by the applicant, and in this case, the detailed meaning thereof will be described in the detailed description of the present disclosure. Thus, the terms used herein should be understood not as simple names, but based on the meaning of the terms and the overall description of the inventive concept.

The term "audio signal processing apparatus" as used herein may include any apparatuses capable of processing an audio signal. In particular, the audio signal processing apparatus may include an apparatus that processes an audio signal and outputs the processed audio signal. In this case, the audio signal processing apparatus may process an audio signal received from another apparatus and output the processed audio signal, or the audio signal processing apparatus itself may generate an audio signal and output the generated audio signal.

The term "system delay error" as used herein means an error caused by a delay of output of an audio signal due to an audio system itself when an audio output device outputs an audio. The system delay error may include a delay occurring during an audio signal transfer process due to a network environment and a delay occurring during signal processing of an audio output device.

Also, the term "distance delay error" as used herein means an error occurring according to the time taken until an audio signal output by an audio output device reaches another device. This distance delay error is caused by a transfer rate of an audio signal. As a transfer distance increases, the distance delay error increases.

FIG. 1 is a diagram illustrating an audio system connected via a wireless network.

Referring to FIG. 1, the audio system includes a plurality of audio signal processing apparatuses, such as a TV 110, speakers 120, 130, 140, and 160, and a mobile terminal 150 carried by a user 170. In FIG. 1, the audio system is connected via a wireless network. The audio system is not limited to the TV 110, the speakers 120, 130, 140, and 160, and the mobile terminal 150, and may include various types of audio signal processing apparatuses. Also, the speakers 120, 130, 140, and 160 may include one type of speaker or various types of speakers.

In FIG. 1, the audio signal processing apparatuses constituting the audio system may provide a collaborative audio play. That is, the audio signal processing apparatuses may reproduce an audio signal in collaboration with one another through a network connection. In realizing the collaborative audio play, it is necessary to synchronize the audio signal processing apparatuses with one another, to output a balanced audio signal and provide a high-quality sound.

However, the audio signal processing apparatuses may have different signal processing characteristics, and a system delay error may occur due to different surrounding environments, in particular, different network environments. For example, in the case of the mobile terminal 150 having a multimedia function, an audio signal processing speed may be affected according to the number of applications being executed, or any other factor affecting the resources available to perform audio signal processing, by the mobile terminal 150. In the case of the speakers 120, 130, 140, and 160, a rate of audio signal reception via a network may vary according to a distance to the TV 110 providing a sound source and the presence or absence of a physical obstacle or other signal transmission/reception interference.

Also, the distance delay error may occur according to the arrangement of the audio signal processing apparatuses. For example, the time taken until audio signals output by the speakers 120, 130, 140, and 160 far away from the user 170 reach the user 170 (i.e., latency) may be different from the time taken until an audio signal output by the mobile terminal 150 near to the user 170 reaches the user 170.

Therefore, in order to provide an optimal high-quality sound, it is necessary to perform signal processing by taking into account characteristics of the audio signal processing apparatuses and surrounding environments.

An exemplary embodiment provides an audio signal processing method and an audio signal processing apparatus for appropriate synchronization between various types of audio signal processing apparatuses.

Figure 2:
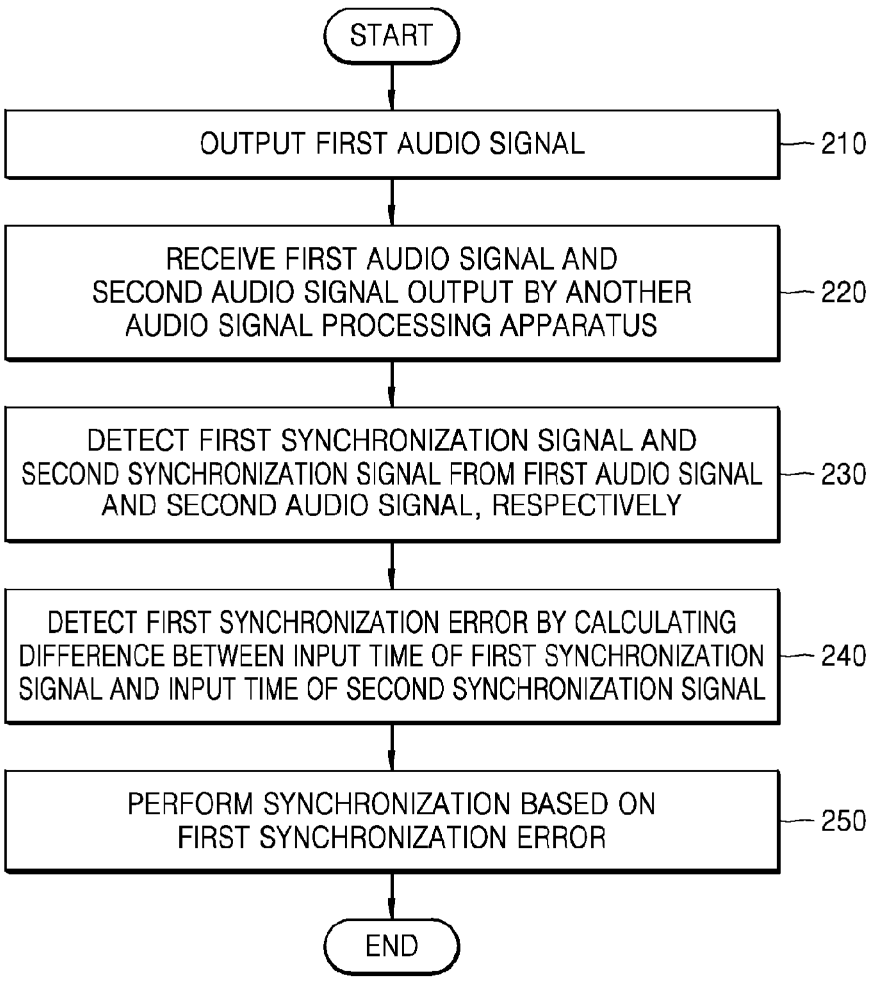
FIG. 2 is a flowchart of an audio signal processing method according to an exemplary embodiment.

FIG. 2 is a flowchart of an audio signal processing method according to an exemplary embodiment.

Referring to FIG. 2, in operation 210, an audio signal processing apparatus outputs a first audio signal. According to an exemplary embodiment, the first audio signal may include a first synchronization signal for synchronization with another audio signal processing apparatus.

In operation 220, the audio signal processing apparatus receives the output first audio signal and a second audio signal output by another audio signal processing apparatus. Like the first audio signal, the second audio signal may include a second synchronization signal for synchronization. According to an exemplary embodiment, the audio signal processing method performs signal processing based on an audio signal actually input to the audio signal processing apparatus while accounting for characteristics of the audio signal processing apparatuses, surrounding environments, and the like.

In operation 230, the first synchronization signal and the second synchronization signal are respectively detected from the first audio signal and the second audio signal. According to an exemplary embodiment, the first synchronization signal and the second synchronization signal may use a specific region having strong center characteristics in the audio signal, that is, a region where an L (left) signal and an R (right) signal are equal beyond a set reference value in the audio signal. Also, the first synchronization signal and the second synchronization signal may be an audible or inaudible signal to be inserted into the audio signal at a set time point. Furthermore, the first synchronization signal and the second synchronization signal may be a watermark to be inserted into the audio signal at a set time point. According to an exemplary embodiment, a more accurate delay error may be calculated by using a separate synchronization signal for synchronization, instead of the entire audio signals, and a processing capacity may be reduced in signal processing for synchronization.

In operation 240, a first synchronization error is detected by calculating a difference between an input time of the first synchronization signal and an input time of the second synchronization signal. The audio signal processing apparatuses are controlled to output the same synchronization signal at the same time. However, a system delay error and a distance delay error may occur according to characteristics of the audio signal processing apparatuses, surrounding environments, and a distance. The first synchronization error may include the system delay error and the distance delay error. According to an exemplary embodiment, the system delay error and the distance delay error may be detected by calculating the difference between the input time of the first synchronization signal and the input time of the second synchronization signal. The process of detecting the first synchronization error will be described in detail below with reference to FIG. 3.

In operation 250, synchronization is performed based on the first synchronization error. According to an exemplary embodiment, the synchronization may be performed by adjusting the audio signal based on the first synchronization error. In this case, the first synchronization error may be monitored, and the synchronization may be gradually performed when the first synchronization error increases to be greater than or equal to a threshold error value. Also, the synchronization may be more quickly according to volume of the audio signal. For example, when the audio signal is adjusted during the synchronization process, a listener may feel discomfort if the audio signal is greatly changed. Therefore, a listener's discomfort may be minimized by gradually performing the synchronization in a normal volume section of audio and more quickly performing the synchronization in a low-volume section in which a listener may experience relatively difficulty in listening to the audio signal.

Furthermore, according to an exemplary embodiment, the synchronization may be performed by adjusting an audio clock rate or adjusting an audio sampling rate through interpolation or decimation.

Also, according to an exemplary embodiment, in a case that there is an audio signal processing apparatus that outputs a video together with an audio, the synchronization may be performed based on the video reproduced by the audio signal processing apparatus. That is, the synchronization may be performed based on lip-sync time at which the video and the audio match each other. In this case, the listener may enjoy a more natural audio/video experience.

As described above, according to an exemplary embodiment, signal processing is performed based on an audio signal actually input, for example after being affected by characteristics of audio signal processing apparatuses, surrounding environments, and the like. Therefore, signal processing may be performed by taking into account the system delay error and the distance delay error occurring according to characteristics of the audio signal processing apparatuses, surrounding environments, and a distance.

Figure 3:
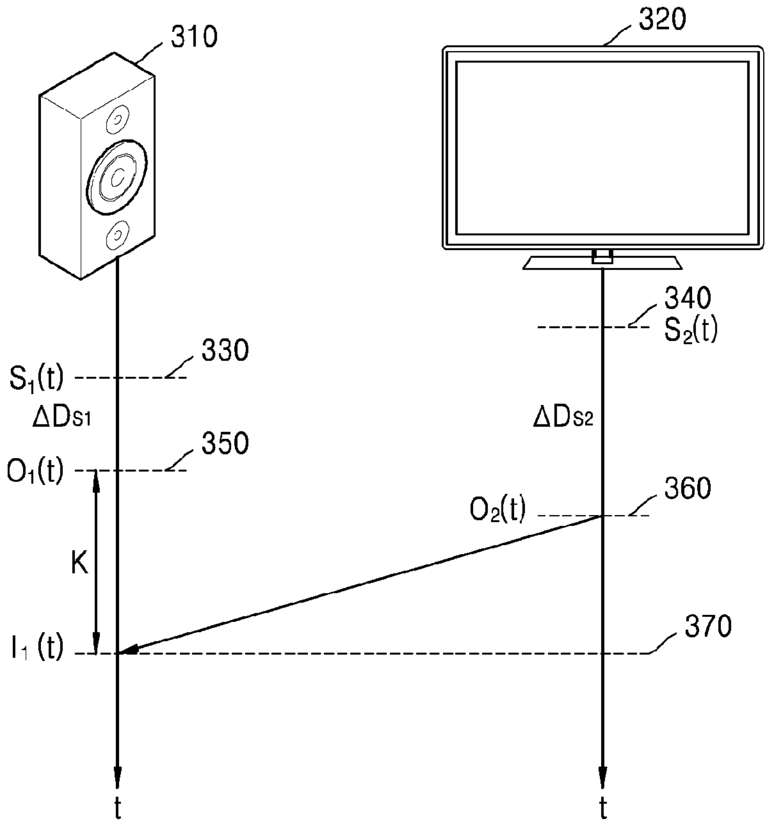
FIG. 3 is a diagram for describing an audio signal processing method according to an exemplary embodiment.

FIG. 3 is a diagram for describing an audio signal processing method according to an exemplary embodiment.

Referring to FIG. 3, an audio system includes a speaker 310 and a TV 320. According to an exemplary embodiment, the speaker 310 may receive an audio signal from the TV 320 via a wireless network (e.g., directly from the TV 310 or via an intermediary routing device) and output the received audio signal.

In order to realize a collaborative audio reproduction, the speaker 310 and the TV 320 may be set to output the same audio signal at the same time point S(t) 330. S(t) 330 represents an apparatus's own time at a physical time t. The apparatus's own time may be the time determined by a sample index of an audio signal, not a local clock of the corresponding apparatus. Ideally, the speaker 310 and the TV 320 have the same time point S(t). However, an error may occur during audio processing and output for various reasons, and the speaker 310 and the TV 320 may have different time points S(t) 330, 340. It is assumed in FIG. 3 that the speaker 310 and the TV 320 have different time points S(t) 330, 340. The time of the speaker 310 is represented by $S_1$ (t) 330, and the time of the TV 320 is represented by $S_2$(t) 340.

In a case that the speaker 310 and the TV 320 are configured to output the same audio signal at a time point t, the speaker 310 and the TV 320 process the audio signal to output the audio signal at $S_1$(t) 330 and $S_2$(t) 340, respectively. However, an audio signal processing speed of the speaker 310 may be different from an audio signal processing speed of the TV 320, and a delay may occur while the speaker 310 receives an audio signal from the TV 320 via the network. Thus, the time point at which the same audio signal is output by the speaker 310 and the TV 320 may be different. That is, an audio signal output time point may be different due to different system delay errors. Therefore, a time point at which a real audio signal is output is a time point corresponding to the sum of S(t) and the system delay error. When the time point at which the real audio signal is output is O(t) and the system delay error $\Delta D_s$, O(t) may be expressed as Equation (1) below:

$$O(t)=S(t)+\Delta D_s \quad (1)$$

Thus, when the time point at which the real audio signal is output by the speaker 310 is $O_1$(t) 350 and the system delay error of the speaker 310 is $\Delta D_{s1}$, $O1(t)=S(t)+\Delta D_{s1}$. Also, when the time point at which the real audio signal is output by the TV 320 is $O_2$(t) 360 and the system delay error of the TV 320 is $\Delta D_{s2}$, $O_2(t)=S(t)+\Delta D_{s2}$.

Furthermore, a distance delay error $\Delta D_d$ occurs according to the time taken until the audio signal output by the TV 320 reaches the speaker 310. By reflecting the distance delay error, the time point at which the audio signal output by the TV 320 reaches the speaker 310 may be set as $I_1$ (t) 370.

In this case, a synchronization error K may be calculated by calculating a difference between the time at which the audio signal output by the speaker 310 is received again by the speaker 310 and the time at which the audio signal output by the TV 320 is received by the speaker 310. That is, the synchronization error K may be detected using Equation (2) below:

$$I_1(t)-O_1(t)=K \quad (2)$$

According to an exemplary embodiment, the synchronization may be performed by adjusting the audio signal output based on the synchronization error detected using Equation (2). In a case that there is an audio signal processing apparatus, such as the TV 320, which outputs a video together with an audio, as illustrated in FIG. 3, a listener may enjoy a more natural video if the synchronization is performed based on lip-sync time at which the video output and the audio output match each other. In this case, the synchronization may be performed by adjusting the audio signal output of the speaker 310. However, embodiments are not limited thereto. The synchronization with the speaker 310 may also be performed by calculating the synchronization error in the TV 320.

When these synchronization processes are performed, the speaker 310 and the TV 320 may output the audio signal after inserting the synchronization signal into the audio signal. A more accurate delay error may be calculated by using a separate synchronization signal for synchronization, instead of the entire audio signals, and a processing capacity may be reduced in signal processing for synchronization.

As described above, according to an exemplary embodiment, signal processing is performed based on an audio signal actually input after being affected by characteristics of audio signal processing apparatuses, surrounding environments, and the like. Therefore, signal processing may be performed by taking into account the system delay error and the distance delay error occurring according to characteristics of the audio signal processing apparatuses, surrounding environments, and a distance.

In the embodiments illustrated in FIGS. 2 and 3, the audio signal processing method for relative synchronization has been described, which performs the synchronization with respect to a specific audio signal processing apparatus. Hereinafter, an audio signal processing method will be described, which is capable of synchronizing an absolute audio signal output time so that the outputs themselves of the audio signal processing apparatuses are performed at the same time.

Figure 4:
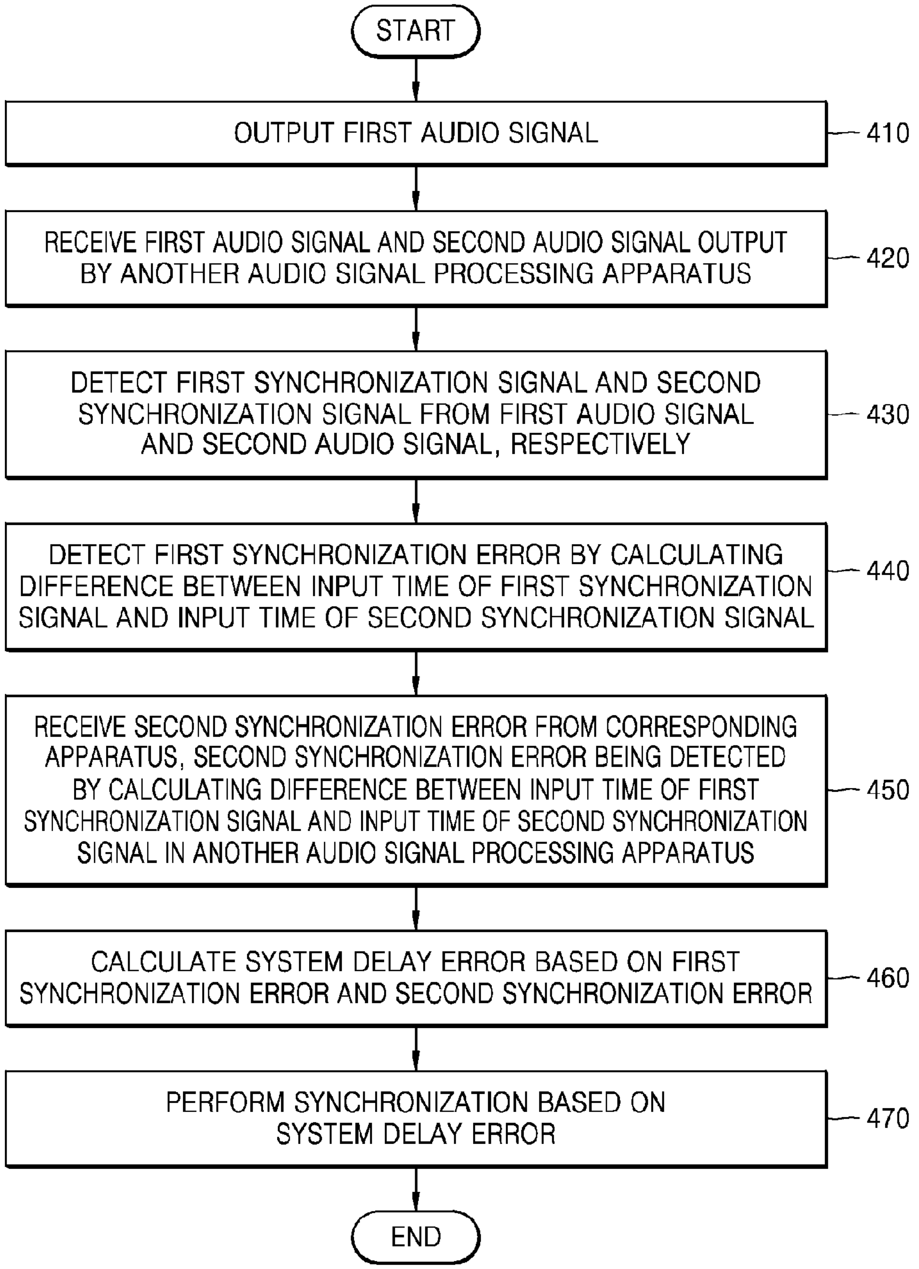
FIG. 4 is a flowchart of an audio signal processing method according to an exemplary embodiment.

FIG. 4 is a flowchart of an audio signal processing method according to another embodiment.

Referring to FIG. 4, in operation 410, an audio signal processing apparatus outputs a first audio signal. According to an exemplary embodiment, the first audio signal may include a first synchronization signal for synchronization with another audio signal processing apparatus.

In operation 420, the audio signal processing apparatus receives the output first audio signal and a second audio signal output by another audio signal processing apparatus. Like the first audio signal, the second audio signal may include a second synchronization signal for synchronization. According to an exemplary embodiment, the audio signal processing method performs signal processing based on an audio signal actually input to the audio signal processing apparatus after being affected by characteristics of the audio signal processing apparatuses, surrounding environments, and the like.

In operation 430, the first synchronization signal and the second synchronization signal are respectively detected from the first audio signal and the second audio signal. According to an exemplary embodiment, the first synchronization signal and the second synchronization signal may use a specific region having strong center characteristics in the audio signal, that is, a region where an L (left) signal and an R (right) signal are equal beyond a set reference value in the audio signal. Also, the first synchronization signal and the second synchronization signal may be an audible or inaudible signals inserted into the audio signal at a set time point. Furthermore, the first synchronization signal and the second synchronization signal may be a watermark to be inserted into the audio signal at a set time point. According to an exemplary embodiment, a more accurate delay error may be calculated by using a separate synchronization signal for synchronization, instead of the entire audio signals, and a processing capacity may be reduced in signal processing for synchronization.

In operation 440, a first synchronization error is detected by calculating a difference between an input time of the first synchronization signal and an input time of the second synchronization signal. Each of the audio signal processing apparatuses is controlled to output the same synchronization signal at the same time. However, a system delay error and a distance delay error may occur according to characteristics of the audio signal processing apparatuses, surrounding environments, and a distance. The first synchronization error may include the system delay error and the distance delay error. According to an exemplary embodiment, the system delay error and the distance delay error may be detected by calculating a difference between the input time of the first synchronization signal and the input time of the second synchronization signal.

In operation 450, a second synchronization error, which is detected by calculating a difference between an input time of the first synchronization signal and an input time of the second synchronization signal in the other audio signal processing apparatus, is received from the corresponding audio signal processing apparatus. According to an exemplary embodiment, the second synchronization error calculated in another apparatus may be received to perform absolute synchronization that performs synchronization based on a specific time. The process of receiving the second synchronization error from the another audio signal processing apparatus may also be performed in any operations of the audio signal processing, and is not necessarily performed after the calculation of the first synchronization error.

In operation 460, a system delay error is calculated based the first synchronization error and the second synchronization error. According to an exemplary embodiment, a difference value between the first synchronization error and the second synchronization error may be calculated, and a half value of the difference value may be calculated as the system delay error. The process of calculating the system delay error will be described in detail below with reference to FIG. 5.

In operation 470, an audio synchronization is performed based on the system delay error. According to an exemplary embodiment, the synchronization may be performed by adjusting the audio signal based on the system delay error. In this case, the synchronization may be performed based on a specific time. In the exemplary embodiments illustrated in FIGS. 2 and 3, because a specific audio signal processing apparatus performs synchronization based on the opposite audio signal processing apparatus, the synchronization is achieved in the specific audio signal processing apparatus only in relation to the opposite audio signal processing apparatus. In contrast, according to exemplary embodiments illustrated in FIGS. 4 and 5, the synchronization is performed so that the outputs themselves of the audio signal processing apparatuses are performed at the same time. Thus, it is possible to synchronize the absolute audio signal output time, not the relative synchronization, in the relation with the specific audio signal processing apparatus.

According to an exemplary embodiment, the system delay error may be monitored, and the synchronization may be gradually performed when the system delay error is greater than or equal to a threshold error value. Also, the synchronization may be performed more rapidly based on volume. When the audio signal is adjusted during the synchronization process, a listener may feel discomfort if the audio signal is greatly changed. Therefore, a listener's discomfort may be minimized by gradually performing the synchronization in a normal section and rapidly performing the synchronization in a low-volume section.

Furthermore, according to an exemplary embodiment, the synchronization may be performed by adjusting an audio clock rate or adjusting an audio sampling rate through interpolation or decimation.

Also, according to an exemplary embodiment, in a case that there is an audio signal processing apparatus that outputs a video together with an audio, the synchronization may be performed based on the video reproduced by the audio signal processing apparatus. That is, the synchronization may be performed based on lip-sync time at which the video and the audio match each other. In this case, the listener may enjoy a more natural audio/video experience.

As described above, according to an exemplary embodiment, signal processing is performed based on an audio signal actually input after being affected by characteristics of audio signal processing apparatuses, surrounding environments, and the like. Therefore, signal processing may be performed by taking into account the system delay error and the distance delay error occurring according to characteristics of the audio signal processing apparatuses, surrounding environments, and a distance. Also, the synchronization may be performed based on a specific time.

Figure 5:
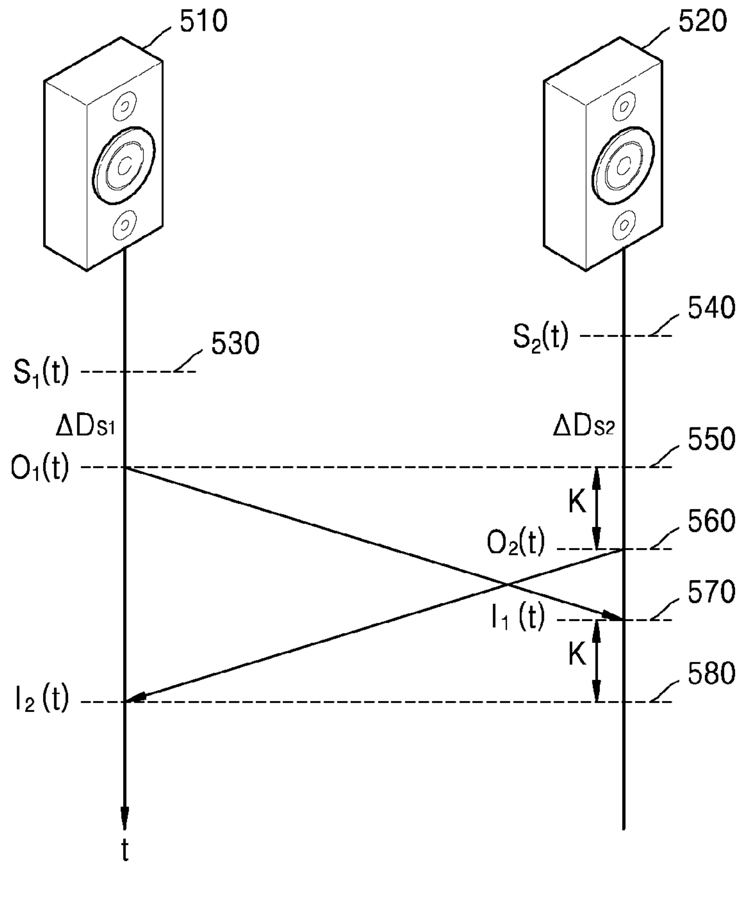
FIG. 5 is a diagram for describing an audio signal processing method according to an exemplary embodiment.

FIG. 5 is a diagram for describing an audio signal processing method according to an exemplary embodiment.

Unlike in FIG. 3, an audio system illustrated in FIG. 5 includes two speakers 510, 520. According to an exemplary embodiment, each of the first speaker 510 and the second speaker 520 may receive an audio signal from a sound source providing device (e.g., TV) via a wireless network and output the received audio signal.

To realize a collaborative audio reproduction, the first speaker 510 and the second speaker 520 may be set to output the same audio signal at the same time point S(t). S(t) represents an apparatus's own time at a physical time t. The apparatus's own time may be the time determined by a sample index of an audio signal, not a local clock of the corresponding apparatus. Ideally, the first speaker 510 and the second speaker 520 have the same S(t). However, an error may occur during an audio processing and output for various reasons, and the first speaker 510 and the second speaker 520 may have different time points S(t). It is assumed in FIG. 5 that the first speaker 510 and the second speaker 520 have different time points S(t) 530, 540. The time of the first speaker 510 is represented by $S_1(t)$ 530, and the time of the second speaker 520 is represented by $S_2(t)$ 540.

In a case that the first speaker 510 and the second speaker 520 are set to output the same audio signal at a time point t, the first speaker 510 and the second speaker 520 process the audio signal to output the audio signal at $S_1(t)$ 530 and $S_2(t)$ 540, respectively. Although set to output the audio signal at the same time point, an error occurs from an output time point because the times of the first speaker 510 and the second speaker 520 are differently set. Furthermore, an audio signal processing speed of the first speaker 510 may be different from an audio signal processing speed of the second speaker 520, and an audio signal reception speed may be changed in the process of receiving the audio signal from the sound source providing device via the network. Thus, the time point at which the same audio signal is output may be different. That is, the audio signal output time point may be different due to different system delay errors.

As described above, a time point at which a real audio signal is output is a time point corresponding to the sum of S(t) and the system delay error. Therefore, the time point at which the real audio signal is output is O(t) and the system delay error is $\Delta D_s$, O(t) may be expressed as Equation (1) below:

$$O(t)=S(t)+\Delta D_s \quad (1)$$

According to Equation (1) above, when the time point at which the real audio signal is output from the first speaker 510 is $O_1(t)$ 550 and the system delay error of the first speaker 510 is $\Delta D_{s1}$, $O_1(t)=S_1(t)+\Delta D_{s1}$. Also, when the time point at which the real audio signal is output by the second speaker 520 is $O_2(t)$ 560 and the system delay error of the second speaker 520 is $\Delta D_{s2}$, $O_2(t)=S_2(t)+\Delta D_{s2}$.

Furthermore, a distance delay error $\Delta D_d$ occurs according to the time taken until the first audio signal output by the first speaker 510 reaches the second speaker 520. In addition, $\Delta D_d$ occurs according to the time taken until the second audio signal output by the second speaker 520 reaches the first speaker 510. Because a relative distance between the first speaker 510 and the second speaker 520 is equal, the distance delay errors thereof are equal to each other.

When the time point at which the first audio signal output by the first speaker 510 by reflecting the distance delay error $\Delta D_d$ reaches the second speaker 520 is $I_1(t)$ 570 and the time point at which the second audio signal output by the second speaker 520 by distance delay error $\Delta D_d$ reaches the first speaker 510 is $I_2(t)$ 580, the following relationship may be obtained.

$$I_1(t)=S_2(t)+\Delta D_{s2}+\Delta D_d=O_2(t)+\Delta D_d \quad (3)$$

$$I_2(t)=S_1(t)+\Delta D_{s1}+\Delta D_d=O_1(t)+\Delta D_d \quad (4)$$

Because the distance delay errors are equal to each other as described above, a synchronization error K is defined by a difference between the time point $O_1(t)$ 550 at which the real audio signal is output by the first speaker 510 and the time point $O_2(t)$ 560 at which the real audio signal is output by the second speaker 520, or a difference between the time point $I_1(t)$ 570 at which the first audio signal output by the first speaker 510 reaches the second speaker 520 and the time point $I_2(t)$ 580 at which the second audio signal output by the second speaker 520 reaches the first speaker 510.

At the physical time t, because $S_1(t)$ and $S_2(t)$ for the first speaker 510 and the second speaker 520 are the equally prearranged time, it may be confirmed from Equation (5) that the synchronization error K is the system delay error between the first speaker 510 and the second speaker 520.

$$K=I_1(t)-I_2(t)=(S_2(t)+\Delta D_{s2}+\Delta D_d)-(S_1(t)+\Delta D_{s1}+\Delta D_d)=\Delta D_{s2}-\Delta D_{s1} \quad (5)$$

The speakers 510, 520 cannot directly know the difference between the time point $O_1(t)$ 550 at which the real audio signal is output by the first speaker 510 and the time point $O_2(t)$ 560 at which the real audio signal is output by the second speaker 520, or the difference between the time point $I_1(t)$ 570 at which the first audio signal output by the first speaker 510 reaches the second speaker 520 and the time point $I_2(t)$ 580 at which the second audio signal output by the second speaker 520 reaches the first speaker 510. Thus, the synchronization error K may be calculated using Equations (6) and (7) below:

$$(I_1(t)-S_2(t))-(I_2(t)-S_1(t))=2K \quad (6)$$

$$K=(I_1(t)-S_2(t))-(I_2(t)-S_1(t))/2 \quad (7)$$

A difference between the time at which the first speaker 510 receives the first audio signal output by the first speaker 510 and the time at which the first speaker 510 receives the second audio signal output by the second speaker 520 may be set as a first synchronization error, and a difference between the time at which the second speaker 520 receives the second audio signal output by the second speaker 520 and the time at which the second speaker 520 receives the first audio signal output by the first speaker 510 may be set as a second synchronization error. In this case, a difference value between the first synchronization error and the second synchronization error may be calculated, and a half value of the difference value is the synchronization error, that is, the system delay error between the first speaker 510 and the second speaker 520.

According to an exemplary embodiment, the synchronization may be performed by adjusting the audio signal output based on the detected system delay error. In this case, the synchronization may be performed based on a specific time. In the exemplary embodiments illustrated in FIGS. 2 and 3, because a specific audio signal processing apparatus performs synchronization based on the opposing audio signal processing apparatus, the synchronization is achieved in the specific audio signal processing apparatus only in relation to the opposing audio signal processing apparatus. In contrast, according to the exemplary embodiments illustrated in FIGS. 4 and 5, the synchronization is performed so that the outputs themselves of the audio signal processing apparatuses are performed at the same time. Thus, it is possible to synchronize the absolute output time, not the relative synchronization, in the relation with the specific audio signal processing apparatus.

When these synchronization processes are performed, the first speaker 510 and the second speaker 520 may output the audio signal after inserting the synchronization signal into the audio signal. A more accurate delay error may be calculated by using a separate synchronization signal for synchronization, instead of the entire audio signals, and a processing capacity may be reduced in signal processing for synchronization.

As described above, according to an exemplary embodiment, signal processing is performed based on an audio signal actually input after being affected by characteristics of audio signal processing apparatuses, surrounding environments, and the like. Therefore, signal processing may be performed by taking into account the system delay error and the distance delay error occurring according to characteristics of the audio signal processing apparatuses, surrounding environments, and a distance. Also, it is possible to synchronize an absolute audio signal output time so that the outputs themselves of the audio signal processing apparatuses are performed at the same time.

Hereinafter, an audio signal processing method for synchronization with respect to three or more audio signal processing apparatuses will be described.

Figure 6:
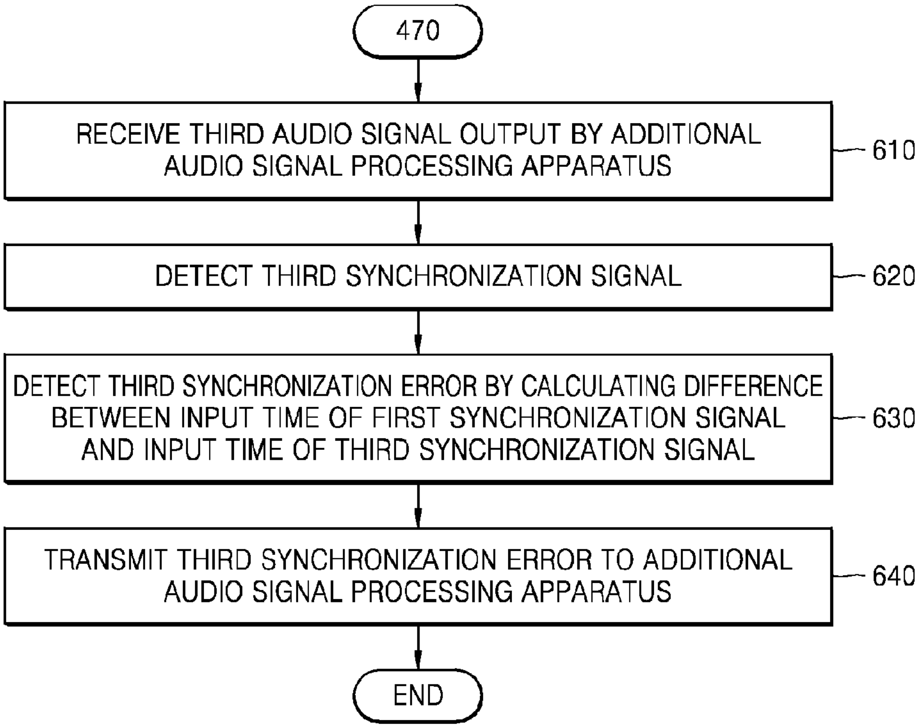
FIG. 6 is a flowchart of a synchronization method according to an exemplary embodiment.

FIG. 6 is a flowchart of an audio signal processing method according to an exemplary embodiment.

Referring to FIG. 6, in operation 610, a third audio signal output by an additional (i.e., a third) audio signal processing apparatus is received. In the present embodiment, the third audio signal may be received to perform synchronization with respect to three or more audio signal processing apparatuses. According to an exemplary embodiment, when the third audio signal is received after two audio signal processing apparatuses (i.e., first and second) are synchronized with each other, the synchronization may be sequentially performed. The process of receiving the third audio signal from the additional audio signal processing apparatus may also be performed in any operations of the audio signal processing, and is not necessarily performed after the two audio signal processing apparatuses are synchronized with each other. It is possible to perform the synchronization at the same time by receiving a plurality of audio signals.

In operation 620, a third synchronization signal is detected from the received third audio signal. In operation 630, a third synchronization error is detected by calculating a difference between an input time of the first synchronization signal and an input time of the third synchronization signal. The process of detecting the third synchronization error is substantially the same as the process of detecting the first synchronization error, as discussed in detail above. That is, the third synchronization error may be detected by calculating the difference between the input time of the first synchronization signal and the input time of the third synchronization signal.

In operation 640, the third synchronization error is transmitted to the additional audio signal processing apparatus. According to an exemplary embodiment, the additional audio signal processing apparatus, which receives the third synchronization error, may perform synchronization based on the third synchronization error. In a case that the synchronization with the other audio signal processing apparatus (e.g., first, second) is achieved before operation 610, if the synchronization with the additional audio signal processing apparatus is performed, the overall synchronization is broken. Therefore, when the synchronization with the other audio signal processing apparatus has already been achieved, the additional audio signal processing apparatus is synchronized based on the currently synchronized audio signal.

When the synchronization with the other audio signal processing apparatus has already been achieved before operation 610, the synchronization may be performed at the same time, or may be sequentially performed.

Figure 7:
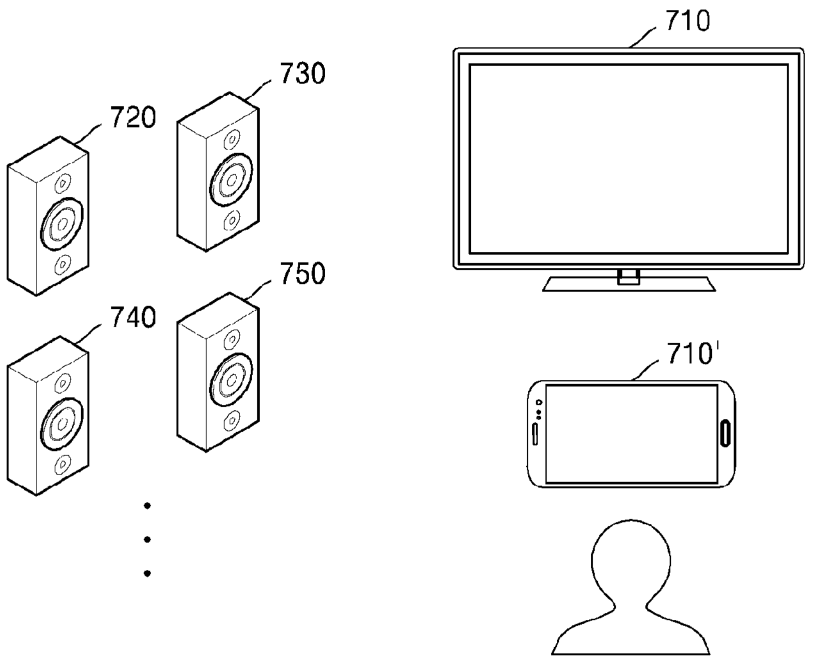
FIG. 7 is a diagram for describing a synchronization method according to an exemplary embodiment.
Figure 7:
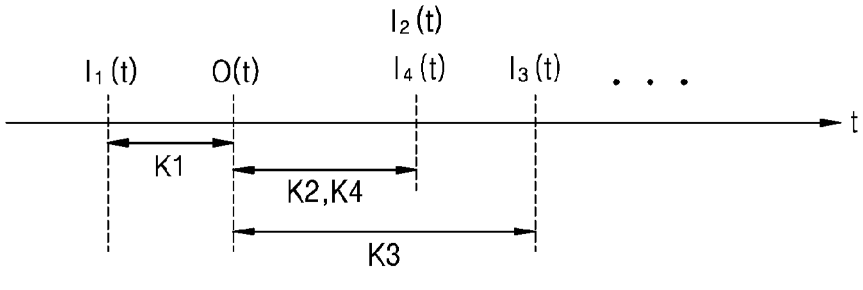

FIG. 7 is a diagram for describing an audio signal processing method according to an exemplary embodiment.

FIG. 7 illustrates a case in which there is an audio signal processing apparatus that outputs video together with audio (i.e., audio/video).

Referring to FIG. 7, an audio system includes a TV 710, a mobile terminal 710', and a plurality of speakers 720, 730, 740, and 750. In the case of synchronizing a plurality of audio signal processing apparatuses, as illustrated in FIG. 7, a reference time point is required. According to an exemplary embodiment, in the case of relative synchronization, an audio signal output time point of a specific audio signal processing apparatus may be set as the reference time point. Also, in the case of absolute synchronization, an audio signal output time point of a specific audio signal processing apparatus may be set as the reference time point, and a specific time point may be set as the reference time point.

In an audio signal processing method of an audio system including a plurality of audio output devices, it is possible to synchronize all the audio output devices at the same time or in sequence. In particular, in a case THAT new devices are added, for example added one by one, sequential synchronization is required.

In the case of sequential synchronization, when the mobile terminal 710' is a reference audio signal processing apparatus, an audio output time point O(t) of the mobile terminal 710' may be a reference time point. When an output reception time point of the TV 710 is $I_1(t)$, a synchronization error between the mobile terminal 710' and the TV 710 is K1. The audio system may adjust an audio signal output of the TV 710 to the audio signal output time point O(t) of the mobile terminal 710'. Then, a synchronization error K2 between the mobile terminal 710' and the speaker 720 may be calculated according to an output reception time point $I_2(t)$ of the speaker 720, and an audio signal output of the speaker 720 may be set to the audio signal output time point O(t) of the mobile terminal 710'. Similar processing may be performed with respect to a synchronization error K3 between the mobile terminal 710' and the speaker 730 according to an output reception time point $I_3(t)$ of the speaker 730, and a synchronization error K4 between the mobile terminal 710' and the speaker 740 according to an output reception time point $I_4(t)$ of the speaker 740, etc.

As such, the audio signal processing apparatuses may be synchronized with one another based on the audio signal output of the reference audio signal processing apparatus. The relative synchronization has been described, but the synchronization is not limited thereto. The audio signal processing apparatuses may be sequentially synchronized with one another based on a specific time point.

In a case that the plurality of audio signal processing apparatuses are synchronized with one another at the same time, all the synchronization signals of the audio signal processing apparatuses are received, and a synchronization error is calculated with respect to all the synchronization signals. Then, the synchronization may be performed at the same time based on a specific time point. In a case that the audio output time point O(t) of the mobile terminal 710' is set as the reference time point, synchronization errors K1, K2, K3, and K4 may be calculated by receiving the synchronization signals of the TV 710 and the plurality of speakers 720, 730, 740, and 750. The synchronization may be performed by adjusting the audio output time points of the TV 710 and the plurality of speakers 720, 730, 740, and 750 to the audio output time point O(t) of the mobile terminal 710 according to the calculated synchronization errors K1, K2, K3, and K4. In this case, all the audio signal processing apparatuses may output the same audio signal at the same time point. The absolute synchronization has been described, but embodiments are not limited thereto. The audio signal processing apparatuses may be synchronized with one another based on a specific audio signal processing apparatus.

Furthermore, the TV 710 and the mobile terminal 710' illustrated in FIG. 7 are apparatuses that output audio and video together. Also, according to an exemplary embodiment, in a case that there is an audio signal processing apparatus that outputs video together with audio, the synchronization may be performed based on the video reproduced by the audio signal processing apparatus. That is, the synchronization may be performed based on lip-sync time at which the video and the audio match each other. In this case, the listener may enjoy a more natural audio/video experience.

Figure 8:
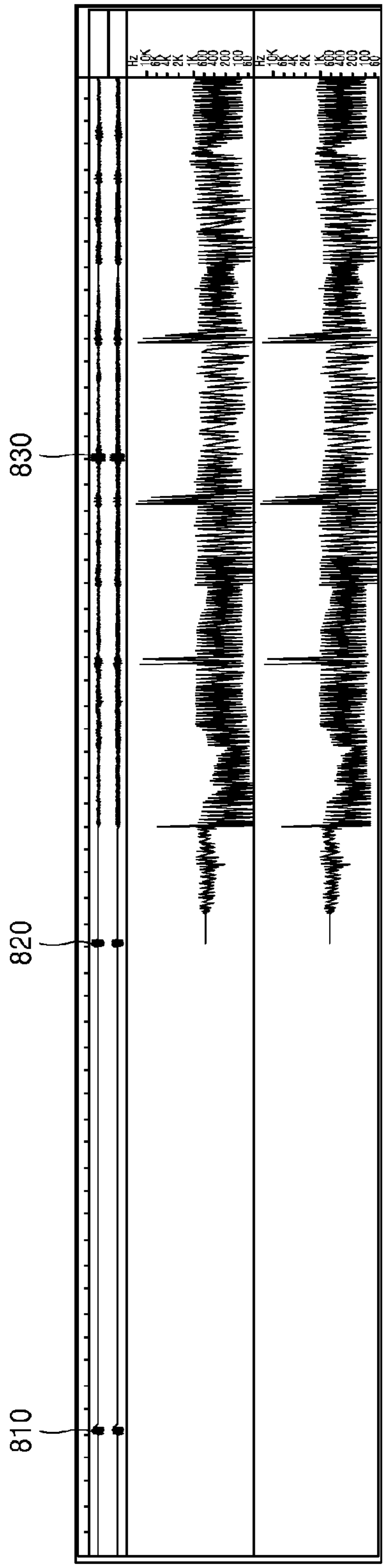
FIG. 8 is a diagram for describing a synchronization signal according to an exemplary embodiment.

FIG. 8 is a diagram for describing a synchronization signal according to an exemplary embodiment.

Referring to FIG. 8, synchronization signals 810, 820, and 830 may be inserted into an audio signal at set time points. According to an exemplary embodiment, the synchronization signals 810, 820, and 830 may be audible or inaudible signals. In a case that the audible signal is used as the synchronization signal, a listener may know that the synchronization is performed, but the listener may be hindered in listening to the reproduced audio. In a case that the inaudible signal is used as the synchronization signal, an audio signal that is in an inaudible range is output. Thus, the inaudible signal may perform a role of the synchronization signal without hindering the user's enjoyment of the audio. Also, the synchronization signals 810, 820, and 830 may be inserted into an audio signal in the form of a watermark. The watermark means a bit pattern inserted into original data of an image, a video, or an audio to identify specific information. According to an exemplary embodiment, the watermark also may be implemented in an audible or inaudible form according to an audio signal output.

Furthermore, the synchronization signal may be inserted before the audio signal output (810), or may be inserted during the audio signal output (820). That is, the synchronization signal may be output together with the audio signal, or only the synchronization signal may be output. In a case that the synchronization signal is output before the audio signal output (810), the synchronization may be achieved between the audio signal processing apparatuses before the audio signal output. Thus, the user may listen to the audio signal in a synchronized state.

According to an exemplary embodiment, a more accurate delay error may be calculated by using a separate synchronization signal for synchronization, instead of the entire audio signals, and a processing capacity may be reduced in signal processing for synchronization.

Figure 9:
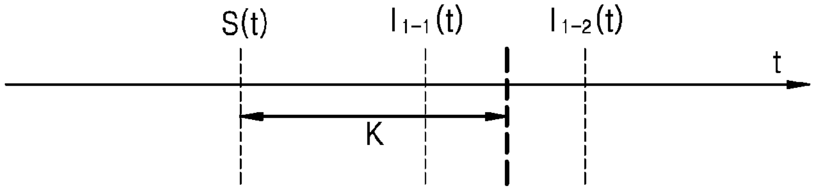
FIG. 9 is a diagram for describing a synchronization signal according to another embodiment.

FIG. 9 is a diagram for describing a synchronization signal according to an exemplary embodiment.

In a case that two or more audio systems are used, an audio signal has an L (left) signal having a left component and an R (right) signal having a right component. Because the L signal and the R signal include different components, the L signal and the R signal may be differently output. However, in some cases, the L signal and the R signal may be output with the same component in a certain region. That is, in a case that the audio signal has a mono signal format, as opposed to a stereo audio format, center characteristics of the audio signal may be strong. This region may be used as a synchronization signal. According to an exemplary embodiment, the synchronization signal and may use a specific region having strong center characteristics in the audio signal, that is, a region where the L signal and the R signal are equal beyond a set reference value in the audio signal.

More specifically, in a case that the audio signal in which the L signal and the R signal are equal beyond the set reference value is output from a set of two speakers (L/R), an average error of the L signal and the R signal in a specific region having strong center characteristics may be set as the synchronization error.

Referring to FIG. 9, when $I_{1-1}(t)$ is the L signal and $I_{1-2}(t)$ is the R signal, the average error K may be set as the synchronization error.

In a case that the specific region having strong center characteristics in the audio signal is used as the synchronization signal, separately generating and detecting the synchronization signal may be unnecessary, and thus, synchronization may be directly applied by various devices without separate processing.

Figure 10:
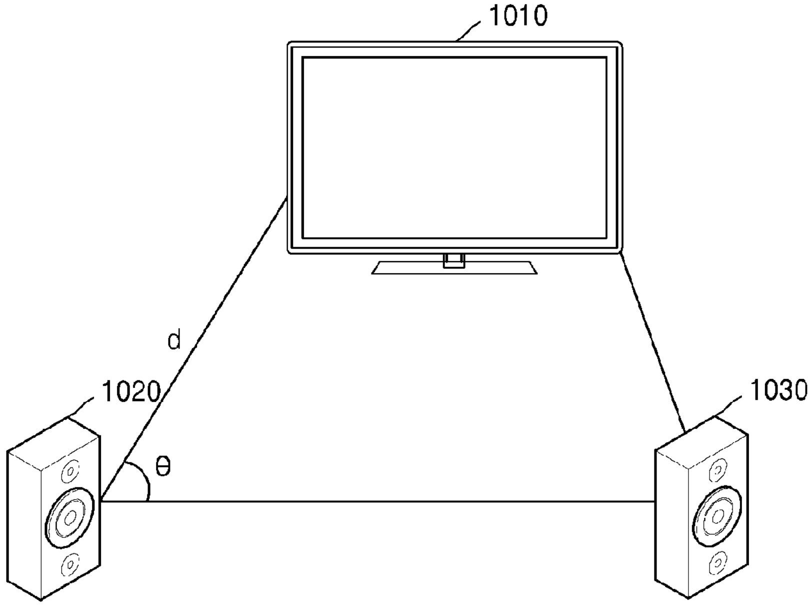
FIG. 10 is a diagram for describing a process of acquiring location information, according to an exemplary embodiment.

FIG. 10 is a diagram for describing a process of acquiring location information, according to an exemplary embodiment.

Referring to FIG. 10, an audio system includes a TV 1010, a speaker 1020, and a speaker 1030. According to an exemplary embodiment, the audio system may calculate a distance delay error according to a distance to another audio signal processing apparatus by using a system delay error and a first synchronization error or a second synchronization error, and acquire location information of the another audio signal processing apparatus based on the distance delay error.

More specifically, according to the exemplary embodiments illustrated in FIGS. 4 and 5, that is, the process of performing the absolute synchronization, the system delay error K may be calculated. Referring to FIG. 5, the distance delay error $\Delta D_d$ may be calculated through Equations (8) and (9) below by using the calculated system delay error K as follows:

$$O_1(t)+K+\Delta D_d=I_2(t) \tag{8}$$

$$\Delta D_d=I_2(t)-O_1(t)-K \tag{9}$$

Because $\Delta D_d$ is the time taken until the audio signal output by the second speaker 520 reaches the first speaker 510, a distance between the first speaker 510 and the second speaker 520 may be calculated by multiplying $\Delta D_d$ by the speed of sound, i.e., about 340 m/s.

By applying these processes to the audio system of FIG. 10, a system delay error between the TV 1010 and the speaker 1020 may be calculated and a distance d between the TV 1010 and the speaker 1020 may be calculated based on the system delay error.

Furthermore, in a case that another audio signal processing apparatus, i.e., the speaker 1030, is present in addition to the speaker 1020, a system delay error between the TV 1010 and the speaker 1020, a system delay error between the speaker 1020 and the speaker 1030, and a system delay error between the speaker 1030 and the TV 1010 may be calculated. A distance between the TV 1010 and the speaker 1020, a distance between the speaker 1020 and the speaker 1030, and a distance between the speaker 1030 and the TV 1010 may be calculated based on the system delay errors. In this case, an angle relationship of the TV 1010, the speaker 1020, and the speaker 1030 may be calculated through a distance relationship of the three audio signal processing apparatuses.

Consequently, the distance relationship and the angle relationship of the TV 1010, the speaker 1020, and the speaker 1030 may be calculated. However, the process of calculating the angles and the distances is not limited thereto, and the angles and the distances may be calculated by using various methods.

Figure 11:
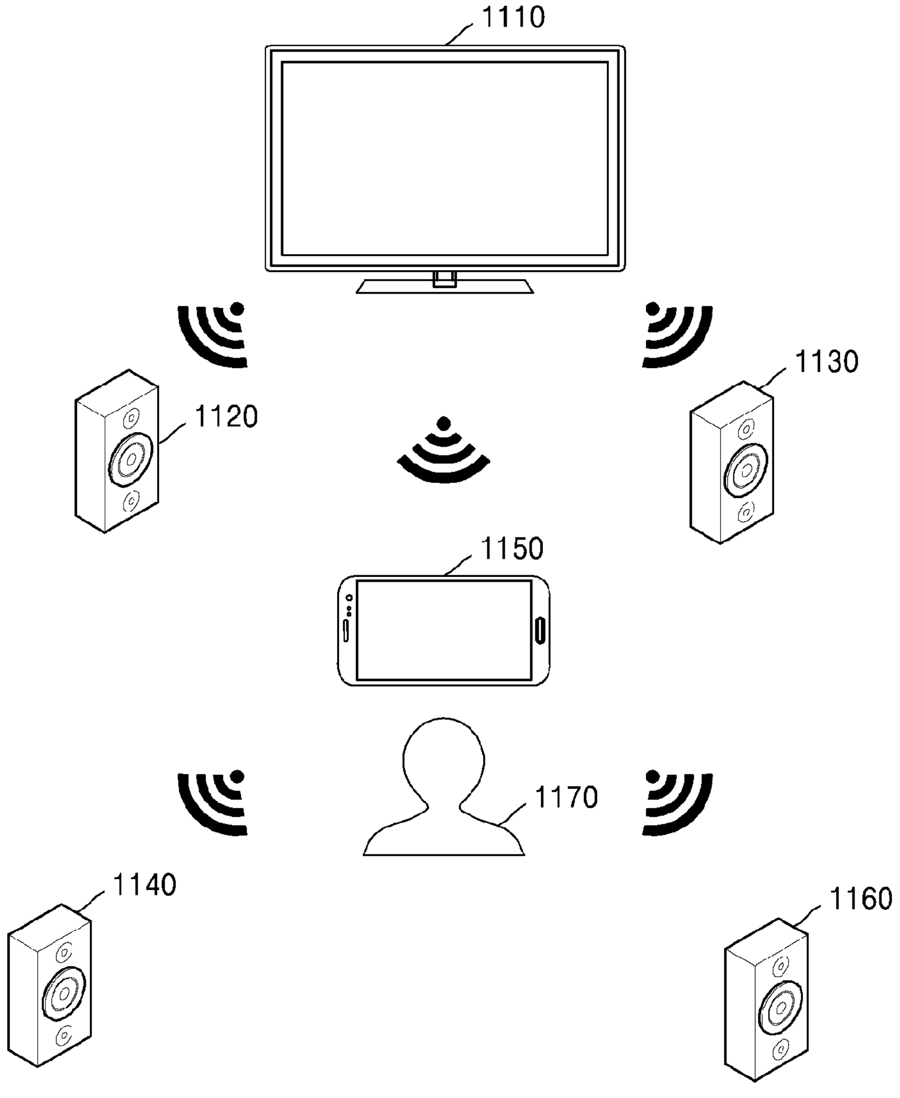
FIG. 11 is a diagram for describing a sound providing method according to an exemplary embodiment.

FIG. 11 is a diagram for describing a sound providing method according to an exemplary embodiment.

FIG. 11 is a diagram illustrating an audio system connected via a wireless network.

Referring to FIG. 11, the audio system includes a plurality of audio signal processing apparatuses, such as a TV 1110, speakers 1120, 1130, 1140, and 1160, and a mobile terminal 1150 of a user 1170. When a collaborative audio reproduction is achieved in the audio system, various reproduction environments for optimal sound combination between the audio signal processing apparatuses may be constructed according to the number of audio signal processing apparatuses (two or more audio signal processing apparatuses), distances between the respective audio signal processing apparatuses, locations of the respective audio signal processing apparatuses (e.g., a distance to a wall, a closed space, etc.), audio reproduction capability of the audio signal processing apparatuses, a target signal level of an audio signal to be output, and a distance to a user.

Hereinafter, a method of constructing an optimal environment capable of performing a collaborative audio reproduction will be described.

FIGS. 12A-D are diagrams for describing a sound providing method based on a layout, according to an exemplary embodiment.

Referring to FIGS. 12A-D, an audio system may be constructed to output different sound components from speakers based on a layout of a TV and the speakers. According to an exemplary embodiment, the audio signal processing apparatus may confirm a layout based on location information with respect to another audio signal processing apparatus and differently set a sound providing method based on the layout. In this case, when the sound providing method is set, a channel assignment and/or a sound component may be set.

Figure 12A:
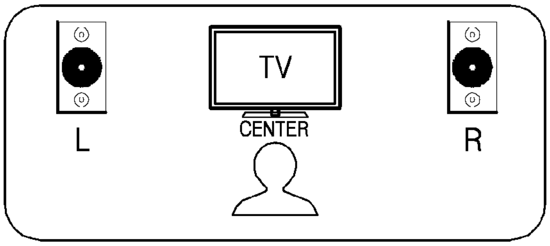
FIGS. 12A-D are diagrams for describing a sound providing method based on a layout, according to an exemplary embodiment.
Figure 12B:
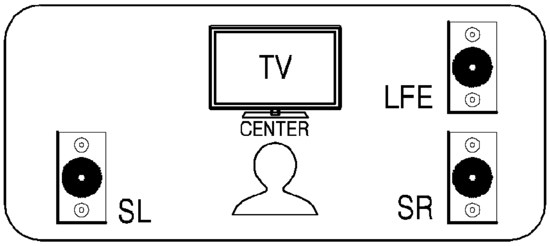
Figure 12C:
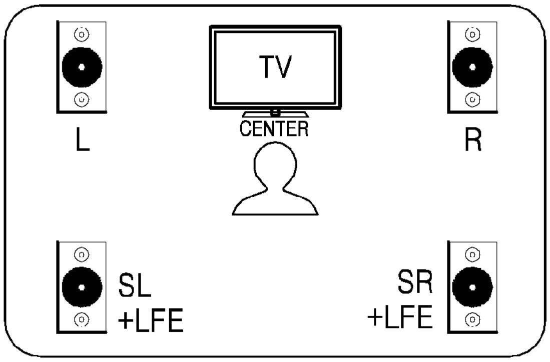
Figure 12D:
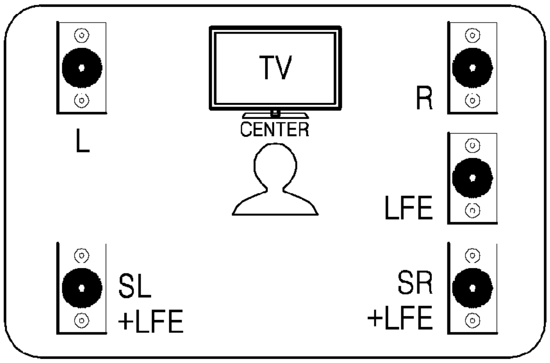

More specifically, referring to FIG. 12A, a TV may output a center signal and speakers may output the other signals. For example, a TV may output a center signal and two speakers may be located on the left and right sides of the TV to output an L signal and an R signal, respectively. Referring to FIG. 12B, a TV may output a center signal, one speaker may be located on a right side of the TV to output a low frequency effect (LFE) component, and two speakers may be located on the left and right sides of a listener to output a surround L (SL) signal and a surround R (SR) signal, respectively. Referring to FIG. 12C, two speakers may be located on the left and right sides of a TV, and two speakers may be located on the left and right sides of a listener. The TV may output a center signal, the two speakers located on the left and right sides of the TV may respectively output an L signal and a R signal, and the two speakers located on the left and right sides of the listener may respectively output an SL signal and an LFE signal (SL+LFE) and an SR signal and an LFE signal (SR+LFE). Referring to FIG. 12D, a separate speaker may be added to the configuration of FIG. 12C to output an LFE signal.

Furthermore, a delay due to a distance may be overcome by taking into account the distance between each speaker and the listener, and a localization phenomenon may be overcome through audio signal level matching.

Accordingly, the sound providing method may be variously set based on the layout by confirming the layout based on the location information of the audio signal processing apparatuses.

Figure 13:
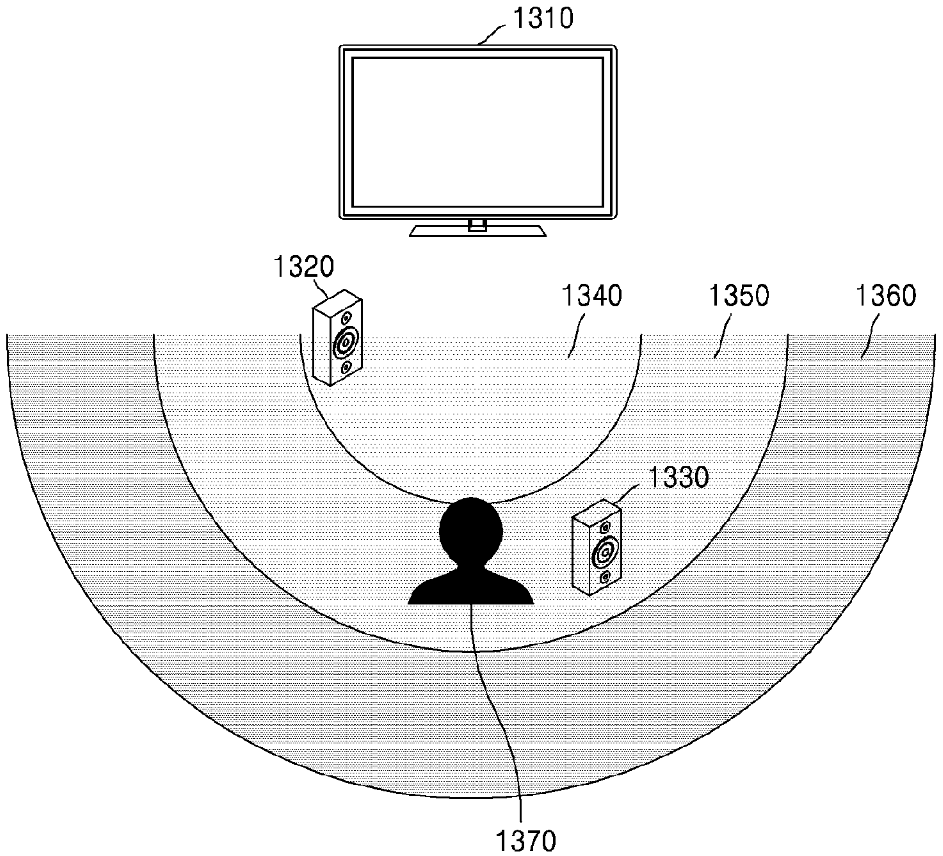
FIG. 13 is a diagram for describing a sound providing method based on a layout, according to another embodiment.

FIG. 13 is a diagram for describing a sound providing method based on a layout, according to an exemplary embodiment.

Referring to FIG. 13, regions 1340, 1350, 1360 where speakers 1320 and 1330 are located may be divided into a short-distance region 1340, a listening region 1350, and a long-distance region 1360 based on a distance between a TV 1310 and a listener 1370. The short-distance region 1340 may be a region between the TV 1310 and the listener 1370, the listening region 1350 may be a region that is at the same distance as the distance between the TV 1310 and the listener 1370, and the long-distance region may be a region that is farther than the listener 1370. According to an exemplary embodiment, the region where the audio signal processing apparatus is located may be determined based on location information, and the sound providing method may be differently determined according to the region.

According to an exemplary embodiment, when the speaker 1320 is located in the short-distance region 1340, the speaker 1320 may be set to emphasize an LFE signal, to provide a rich LFE signal to the listener 1370 and provide an audio signal having a wide range. Also, when the speaker 1330 is located in the listening region 1350, the speaker 1330 may be set to reduce a volume of the audio and increase a resolution, to allow the listener 1370 to clearly listen to the audio signal while minimizing ambient disturbance due to the audio signal. In this case, a speaker of the TV 1310 may be turned off.

Figure 14:
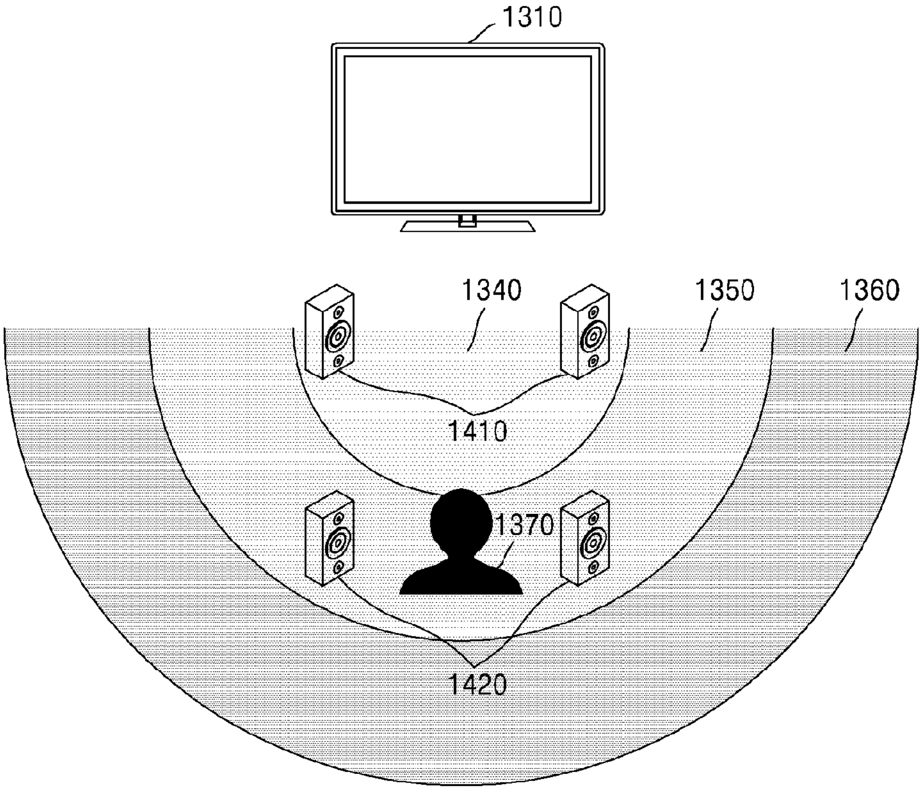
FIG. 14 is a diagram for describing a sound providing method based on a layout, according to another embodiment.

FIG. 14 is a diagram for describing a sound providing method based on a layout, according to an exemplary embodiment.

Referring to FIG. 14, regions 1340, 1350, 1360 where speakers 1410 and 1420 are located may be divided into a short-distance region 1340, a listening region 1350, and a long-distance region 1360, as described with reference to FIG. 13. Unlike in FIG. 13, two speakers 1410, 1420 are present in each region. Generally, the two speakers may be located on the left and right sides of a listener 1370. According to an exemplary embodiment, whether the audio signal processing apparatus is located on a left-side region or a right-side region may be determined based on location information, and the sound providing method may be differently determined according to the region. That is, a sound setting may be changed according to the left and right arrangement of the speakers as well as a distance between a TV 1310 and a listener 1370.

According to an exemplary embodiment, when two speakers 1410 are located in the short-distance region 1340, the two speakers 1410 may be set to output a front L (FL) signal or a front R (FR) signal according to whether the two speakers 1410 are located on the left side or the right side of the listener 1370. In some cases, an L/R/center channel setting may be performed by setting a TV speaker as a center speaker. At this time, it is possible to provide a clear, high fidelity sound or provide a wide sound field by performing signal processing by taking into account the locations and channel characteristics of the speakers as well as a simple channel setting between the speakers. Also, when the two speakers 1420 are located in the listening region 1350 or the long-distance region 1360, the two speakers 1420 may be set to output an SL signal or an SR signal according to whether the speakers 1420 are located on the left side or the right side of the listener 1370. Even in this case, an LFE of the entire sound may be strengthened without a separate woofer channel speaker by additionally reproducing an LFE signal through a reproduction capability analysis or the like of a speaker assigned as a surround channel as well as a simple surround channel setting. When the speakers are located in both the short-distance region and the listening region, an optimal sound may be provided through a combination of the exemplary embodiments for the short-distance region and the listening region.

As described above, according to an exemplary embodiment, various sound providing methods may be set based on various layouts, such as the distance between the listener and the speakers, the left and right arrangement of the speakers, and the like.

Furthermore, the sound providing method may be set based on results of content analysis and surrounding environment analysis. According to an exemplary embodiment, a setting may be performed to strengthen a specific range or increase a resolution according to content. For example, when the content is rock music, an LFE signal may be strengthened to provide a rich low-pitched sound, and when the content is news, a resolution may be increased to make a sound clear. Also, when the layout of the audio signal processing apparatus is known in a relation to a wall, the audio signal output may be adjusted by taking into account the degree of influence by the wall.

Figure 15:
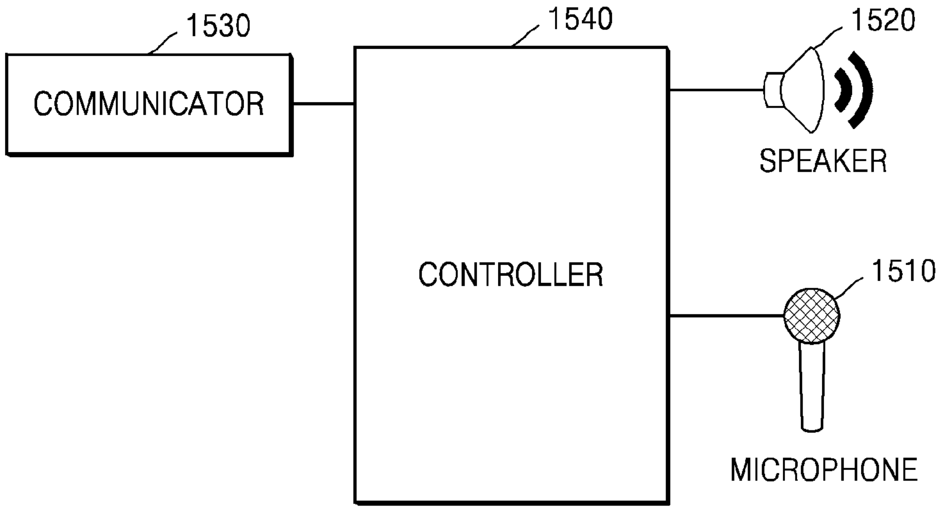
FIG. 15 is a block diagram of an audio signal processing apparatus according to an exemplary embodiment.

FIG. 15 is a block diagram of an audio signal processing apparatus according to an exemplary embodiment.

According to an exemplary embodiment, the audio signal processing apparatus may include a microphone 1510, a speaker 1520, a communicator 1530, and a controller 1540.

The microphone 1510 is configured to receive an audio signal. According to an exemplary embodiment, the microphone 1510 may receive a first audio signal output by the speaker 1520, and a second audio signal output by another (e.g., second) audio signal processing apparatus. Also, the microphone 1510 may receive a third audio signal output by an additional (e.g., third) audio signal processing apparatus.

The speaker 1520 is configured to output an audio signal. According to an exemplary embodiment, the speaker 1520 may output the first audio signal. The first audio signal may include a first synchronization signal for synchronization.

The communicator 1530 is configured to communicate with an external device, and may be an wireless transmitter/receiver that operates according to one or more wireless protocols, such as 802.11x, Bluetooth, etc. With reference to FIG. 15, the audio signal processing apparatus has been described as including the communicator 1530, but in some embodiments, the audio signal processing apparatus may not include the communicator 1530. According to an exemplary embodiment, the communicator 1530 may receive a second synchronization error from the another audio signal processing apparatus, and the second synchronization error is detected by calculating a difference between an input time of the first synchronization signal and an input time of the second synchronization signal in the another audio signal processing apparatus. Also, the communicator 1530 may transmit a third synchronization error to the further another audio signal processing apparatus, wherein the third synchronization error is calculated based on the first synchronization signal and a third synchronization signal detected from the third audio signal output by the further another audio signal processing apparatus. In this case, the further another audio signal processing apparatus may perform synchronization based on the third synchronization error.

The controller 1540 may be a microprocessor, central processing unit, microcontroller, or other controlling element to control an overall operation of the audio signal processing apparatus and may control operations of and interaction between the microphone 1510, the speaker 1520, and the communicator 1530 to process an audio signal.

According to an exemplary embodiment, the controller 1540 may detect the first synchronization signal and the second synchronization signal from the first audio signal and the second audio signal, detect the first synchronization error by calculating the difference between the input time of the first synchronization signal and the input time of the second synchronization signal, and perform synchronization based on the first synchronization error. That is, the controller 1540 may perform relative synchronization to perform synchronization based on a specific audio signal processing apparatus. At this time, the first synchronization signal and the second synchronization signal may use a region where an L signal and an R signal in the audio signal are equal beyond a set reference value. The first synchronization signal and the second synchronization signal may be an audible or inaudible signal to be inserted into the audio signal at a set time point. Also, the first synchronization signal and the second synchronization signal may be a watermark to be inserted into the audio signal at a set time point.

Furthermore, when the synchronization is performed based on the first synchronization error, the controller 1540 may calculate a system delay error based on the first synchronization error and the second synchronization error received through the communicator 1530, and perform the synchronization based on the system delay error. That is, the controller 1540 may synchronize an absolute audio signal output time so that the outputs themselves of the audio signal processing apparatuses are performed at the same time.

When the system delay error is calculated based on the first synchronization error and the second synchronization error, the controller 1540 may calculate a difference value between the first synchronization error and the second synchronization error and calculate a half value of the difference value as the system delay error.

The controller 1540 may detect the third synchronization signal from the third audio signal and detect the third synchronization error by calculating a difference between the input time of the first synchronization signal and the input time of the third synchronization signal.

According to an exemplary embodiment, when the synchronization is performed based on the first synchronization error, the controller 1540 may monitor the first synchronization error and gradually perform synchronization when the first synchronization error is greater than or equal to a threshold error value.

When the first synchronization error is greater than or equal to the threshold error value and thus the synchronization is gradually performed, the controller 1540 may perform synchronization more rapidly as a volume of the audio decreases.

When the synchronization is performed based on the first synchronization error, the controller 1540 may adjust an audio clock rate.

When the synchronization is performed based on the first synchronization error, the controller 1540 may adjust an audio sampling rate through interpolation or decimation.

Also, the controller 1540 may calculate a distance delay error according to a distance to another audio signal processing apparatus by using the system delay error and the first synchronization error or the second synchronization error, and acquire location information of the other audio signal processing apparatus based on the distance delay error. According to an exemplary embodiment, the location information may include a distance to the another audio signal processing apparatus and/or an angle with respect to the other audio signal processing apparatus.

Also, according to an exemplary embodiment, the controller 1540 may check a layout according to the location information with respect to the other audio signal processing apparatus and set a sound providing method based on the checked layout. In this case, the audio signal processing apparatus may be an apparatus that reproduces video together with audio.

Also, when the sound providing method is set based on the layout, the controller 1540 may set a channel assignment and/or a sound component.

When the layout is determined based on the location information with respect to the another audio signal processing apparatus, the controller 1540 may discriminate a short-distance region, which is a region between the listener and the another audio signal processing apparatus, a listening region, which is at the same distance as the distance between the listener and the another audio signal processing apparatus, and a long-distance region, which is farther than the listener, based on the location of the listener and the distance to the another audio signal processing apparatus, and may check whether the audio signal processing apparatus is located in the short-distance region, the listening region, or the long-distance region.

When the sound providing method is set based on the layout, if the audio signal processing apparatus is located in the short-distance region, the controller 1540 may perform a setting to emphasize an LFE signal.

When the sound providing method is set based on the layout, if the audio signal processing apparatus is located in the listening region, the controller 1540 may perform a setting to lower the volume of the audio and increase the resolution.

When the layout is checked based on the location information with respect to the another audio signal processing apparatus, the controller 1540 may discriminate a left-side region and a right-side region of the another audio signal processing apparatus based on the location of the listener, and determine whether the audio signal processing apparatus is located in left-side region or the right-side region of the another audio signal processing apparatus.

When the sound providing method is set based on the layout, if the audio signal processing apparatus is located in the short-distance region, the controller 1540 may perform a setting to output an FL signal or an FR signal according to whether the audio signal processing apparatus is located in the left-side region or the right-side region.

Also, when the sound providing method is set based on the layout, if another audio signal processing apparatus is located in the listening region or the long-distance region, the controller 1540 may perform a setting to output an SL signal or an SR signal according to whether the audio signal processing apparatus is located in a left-side region or a right-side region.

According to an exemplary embodiment, the audio signal processing apparatus may further include additional components for audio signal processing. For example, the audio signal processing apparatus may further include a storage configured to store the audio signal.

Figure 16:
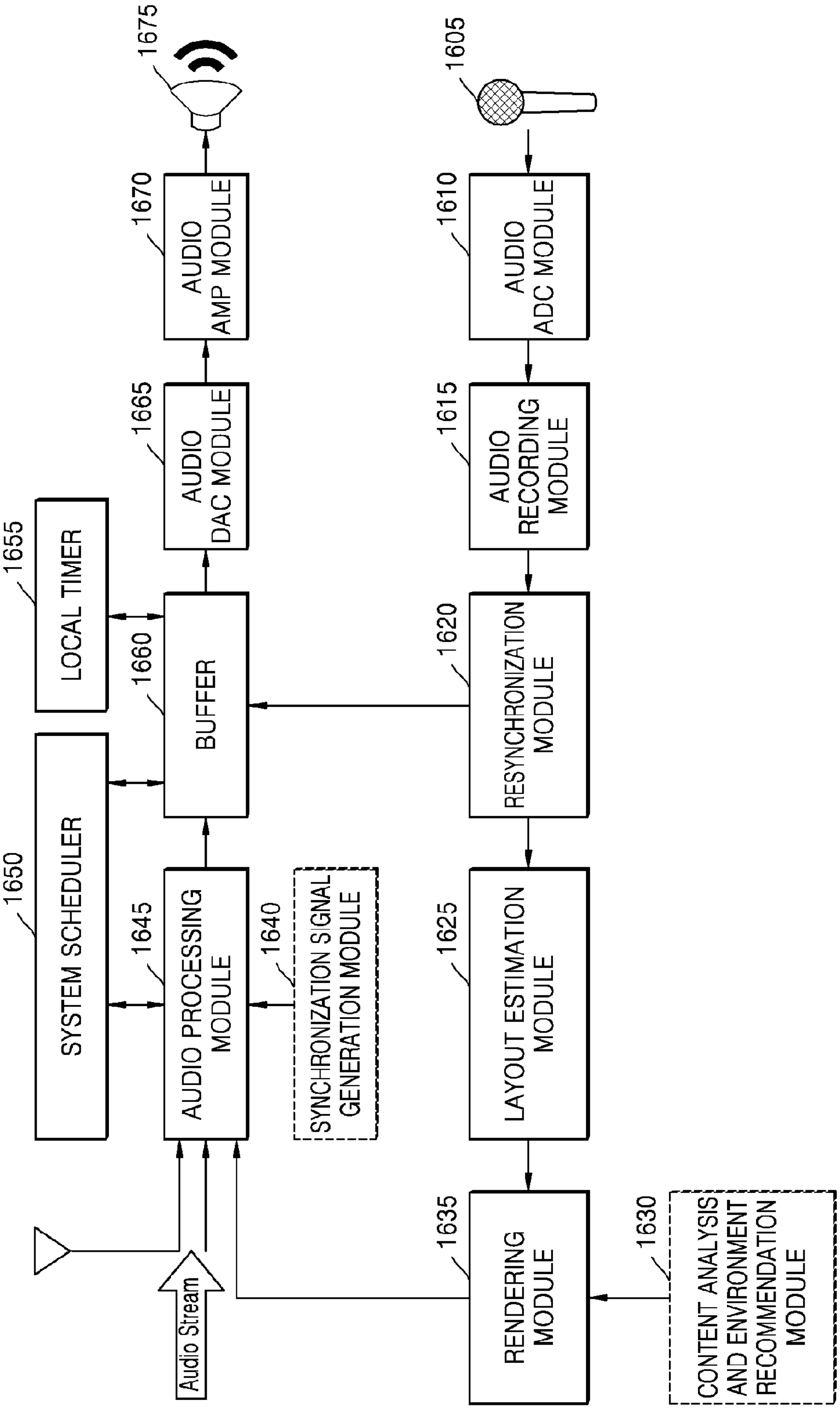
FIG. 16 is a block diagram of an audio signal processing apparatus according to an exemplary embodiment.

FIG. 16 is a block diagram of an audio signal processing apparatus according to an exemplary embodiment.

The processing of the audio signal processing apparatus will be described based on a signal flow. The audio signal processing apparatus receives an audio signal through a microphone 1605. An audio analog-to-digital conversion (ADC) module 1610 converts the audio signal into a digital signal, and an audio recording module 1615 records the received audio signal. A resynchronization module 1620 controls a buffer 1660 to adjust audio to be output, based on the received audio signal. The buffer 1660 controls an output time point of the audio signal received from an audio processing module 1645 through control of a system scheduler 1650, a local timer 1655, and the resynchronization module 1620, and transmits the audio signal to an audio digital-to-analog conversion (DAC) module 1665. The audio DAC module 1665 converts the audio signal into an analog signal, and an audio amp module 1670 amplifies the analog signal. A speaker 1675 outputs the amplified analog signal. In this process, a synchronization signal generated by a synchronization signal generation module 1640 may be inserted into the audio signal and be then output.

Also, the audio signal processing apparatus according to the present embodiment may process the audio signal according to surrounding environments and a layout. A layout estimation module 1625 may estimate a layout of another audio signal processing apparatus by using a synchronization error or a system delay error calculated by the resynchronization module 1620, and a rendering module 1635 may control the audio processing module 1645 to generate a signal by taking into account the estimated layout. The rendering module 1635 may receive content and information about surrounding environments from a content analysis and environment recommendation module 1630 and control the audio processing module 1645 to generate a signal by taking into account the content and the surrounding environments.

The exemplary embodiments set forth herein may be embodied as program instructions that can be executed by various computing units and recorded on a non-transitory computer-readable recording medium. Examples of the non-transitory computer-readable recording medium may include program instructions, data files, and data structures solely or in combination. The program instructions recorded on the non-transitory computer-readable recording medium may be specifically designed and configured for the inventive concept, or may be well known to and usable by those of ordinary skill in the field of computer software. Examples of the non-transitory computer-readable recording medium may include magnetic media (e.g., a hard disk, a floppy disk, a magnetic tape, etc.), optical media (e.g., a compact disc-read-only memory (CD-ROM), a digital versatile disk (DVD), etc.), magneto-optical media (e.g., a floptical disk, etc.), and a hardware device specially configured to store and execute program instructions (e.g., a ROM, a random access memory (RAM), a flash memory, etc.). Examples of the program instructions may include not only machine language codes prepared by a compiler but also high-level codes executable by a computer by using an interpreter.

It should be understood that exemplary embodiments described herein should be considered in a descriptive sense only and not for purposes of limitation. Descriptions of features or aspects within each embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An audio signal processing method of a first audio signal processing apparatus, the method comprising:

outputting a first audio signal by the first audio signal processing apparatus;

receiving the first audio signal, the first audio signal output from the first audio signal processing apparatus;

receiving a second audio signal, the second audio signal output from a second audio signal processing apparatus;

detecting a first synchronization signal in the first audio signal;

detecting a second synchronization signal in the second audio signal;

determining a first synchronization error of a difference between a time at which the first synchronization signal is received and a time at which the second synchronization signal is received;

receiving a second synchronization error from the second audio signal processing apparatus, the second synchronization error being a difference between a time at which the first synchronization signal is received by the second audio signal processing apparatus and a time at which the second synchronization signal is received by the second audio signal processing apparatus; and synchronizing audio output of the first audio signal processing apparatus with audio output of the second audio signal processing apparatus based on the first synchronization error, wherein the synchronizing comprises:

calculating a system delay error based the first synchronization error and the second synchronization error; and synchronizing the audio output of the first audio signal processing apparatus with the audio output of the second audio signal processing apparatus based on the system delay error.

2. The audio signal processing method of claim 1, wherein the calculating comprises:

calculating a difference between the first synchronization error and the second synchronization error; and calculating a half of the difference between the first synchronization error and the second synchronization error as the system delay error.

3. The audio signal processing method of claim 1, wherein the first synchronization signal and the second synchronization signal use a region where a left (L) signal and a right (R) signal in the audio signal are equal beyond a set reference value.

4. The audio signal processing method of claim 1, wherein the first synchronization signal and the second synchronization signal are one of an audible signal and an inaudible signal.

5. The audio signal processing method of claim 1, wherein the first synchronization signal and the second synchronization signal are a watermark.

6. The audio signal processing method of claim 1, wherein synchronizing comprises:

monitoring the first synchronization error; and adaptively synchronizing the audio output of the first audio signal processing apparatus with the audio output of the second audio signal processing apparatus when the first synchronization error is greater than or equal to a set value.

7. The audio signal processing method of claim 1, wherein the synchronizing comprises adjusting at least one of an audio clock rate or an audio sampling rate, wherein the audio sampling rate is adjusted through interpolation or decimation.

8. The audio signal processing method of claim 1, further comprising:

calculating a distance delay error according to a distance from the first audio signal processing apparatus to the second audio signal processing apparatus by using the system delay error and one of the first synchronization error and the second synchronization error; and acquiring location information of the second audio signal processing apparatus based on the distance delay error.

9. The audio signal processing method of claim 8, further comprising:

determining an audio system layout based on the location information with respect to the second audio signal processing apparatus; and setting a sound providing method based on the audio system layout.

10. The audio signal processing method of claim 9, wherein the setting comprises setting at least one of a channel assignment and a sound component.

11. A first audio signal processing apparatus comprising:

a speaker configured to output a first audio signal;

a microphone configured to receive the first audio signal and receive a second audio signal output, the first audio signal output from the first audio signal processing apparatus and the second audio signal output from a second audio signal processing apparatus; and a controller configured to detect a first synchronization signal in the first audio signal and a second synchronization signal in the second audio signal, determine a first synchronization error of a difference between a time at which the first synchronization signal is received and a time at which the second synchronization signal is received, and synchronize audio output of the first audio signal processing apparatus with audio output of the second audio signal processing apparatus based on the first synchronization error.

12. The audio signal processing apparatus of claim 11, further comprising:

a transceiver configured to receive a second synchronization error from the second audio signal processing apparatus, the second synchronization error being a difference between a time at which the first synchronization signal is received by the second audio signal processing apparatus and a time at which the second synchronization signal is received by the second audio signal processing apparatus, wherein the controller is further configured synchronize by calculating a system delay error based the first synchronization error and the second synchronization error, and synchronizing the audio output of the first audio signal processing apparatus with the audio output of the second audio signal processing apparatus based on the system delay error.

13. The audio signal processing apparatus of claim 12, wherein the controller is further configured to calculate the system delay error by calculating a difference between the first synchronization error and the second synchronization error, and calculating a half of the difference between the first synchronization error and the second synchronization error as the system delay error.

14. The audio signal processing apparatus of claim 11, wherein the first synchronization signal and the second synchronization signal use a region where a left (L) signal and a right (R) signal in the audio signal are equal beyond a set reference value.

15. The audio signal processing apparatus of claim 11, wherein the controller is further configured to synchronize by monitoring the first synchronization error and adaptively synchronizing the audio output of the first audio signal processing apparatus with the audio output of the second audio signal processing apparatus when the first synchronization error is greater than or equal to a set value.

16. The audio signal processing apparatus of claim 11, wherein the controller is further configured to synchronize by adjusting at least one of an audio clock rate or an audio sampling rate, wherein the audio sampling rate is adjusted through interpolation or decimation.

17. The audio signal processing apparatus of claim 12, wherein the controller is further configured to calculate a distance delay error according to a distance from the first audio signal processing apparatus to the second audio signal processing apparatus by using the system delay error and one of the first synchronization error and the second synchronization error, and to acquire location information of the second audio signal processing apparatus based on the distance delay error.

18. The audio signal processing apparatus of claim 17, wherein the controller is further configured to determine an audio system layout based on the location information with respect to the second audio signal processing apparatus, and to set a sound providing method based on the audio system layout.

19. A non-transitory computer-readable recording medium having recorded thereon a program for performing the method of claim 1 on an audio signal processing apparatus.

* * * * *